(12) United States Patent
Minamio

(10) Patent No.: US 8,772,923 B2
(45) Date of Patent: Jul. 8, 2014

(54) SEMICONDUCTOR DEVICE HAVING LEADS WITH CUTOUT AND METHOD OF MANUFACTURING THE SAME

(75) Inventor: Masanori Minamio, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/581,901

(22) PCT Filed: Jan. 19, 2012

(86) PCT No.: PCT/JP2012/000313
§ 371 (c)(1),
(2), (4) Date: Aug. 30, 2012

(87) PCT Pub. No.: WO2012/111254
PCT Pub. Date: Aug. 23, 2012

(65) Prior Publication Data
US 2012/0326289 A1    Dec. 27, 2012

(30) Foreign Application Priority Data
Feb. 15, 2011 (JP) ................. 2011-029362

(51) Int. Cl.
*H01L 23/48* (2006.01)
*H01L 23/52* (2006.01)
*H01L 23/495* (2006.01)
*H01L 29/40* (2006.01)
*H01L 21/00* (2006.01)

(52) U.S. Cl.
USPC ........... 257/692; 257/674; 257/690; 257/734; 257/784; 257/E23.043; 257/E23.046; 257/E23.05; 257/E23.07; 438/111; 438/112; 438/123; 438/124

(58) Field of Classification Search
USPC .......... 257/674, 690, 692, 734, 784, E23.043, 257/E23.046, E23.05, E23.07; 438/111, 438/112, 123, 124
See application file for complete search history.

(56) References Cited

U.S. PATENT DOCUMENTS

| 5,285,104 A | 2/1994 | Kondo et al. |
| 6,081,029 A * | 6/2000 | Yamaguchi .................. 257/718 |
| 6,208,020 B1 * | 3/2001 | Minamio et al. .............. 257/684 |

(Continued)

FOREIGN PATENT DOCUMENTS

| JP | 05-095079 A | 4/1993 |
| JP | 08-236687 A | 9/1996 |

(Continued)

OTHER PUBLICATIONS

International Search Report mailed Apr. 10, 2012 issued in corresponding International Application No. PCT/JP2012/000313.

*Primary Examiner* — Ida M Soward
(74) *Attorney, Agent, or Firm* — McDermott Will & Emery LLP

(57) ABSTRACT

A semiconductor device includes: leads (5) in each of which a cutout (5a) is formed; a die pad (11); a power element (1) held on the die pad (11); and a package (6) made of a resin material, and configured to encapsulate inner end portions of the leads (5), and the die pad (11) including the power element (1). The cutout (5a) is located in a region of each of the leads (5) including a portion of the lead (5) located at a boundary between the lead (5) and the package (6), and is filled with a resin material.

16 Claims, 8 Drawing Sheets

(56) References Cited

U.S. PATENT DOCUMENTS

| | | | |
|---|---|---|---|
| 6,400,004 B1 * | 6/2002 | Fan et al. | 257/666 |
| 6,611,047 B2 * | 8/2003 | Hu et al. | 257/666 |
| 6,713,849 B2 * | 3/2004 | Hasebe et al. | 257/667 |
| 6,777,788 B1 * | 8/2004 | Wan et al. | 257/670 |
| 6,882,048 B2 * | 4/2005 | Ikenaga et al. | 257/736 |
| 6,909,168 B2 * | 6/2005 | Minamio et al. | 257/670 |
| 6,984,880 B2 * | 1/2006 | Minamio et al. | 257/676 |
| 6,995,510 B2 * | 2/2006 | Murakami et al. | 313/512 |
| 7,253,508 B2 * | 8/2007 | Liu et al. | 257/678 |
| 7,397,112 B2 * | 7/2008 | Sato et al. | 257/666 |
| 7,550,828 B2 * | 6/2009 | Ramakrishna et al. | 257/676 |
| 7,777,310 B2 * | 8/2010 | Punzalan et al. | 257/676 |
| 7,804,159 B2 * | 9/2010 | Shimanuki | 257/666 |
| 8,093,619 B2 * | 1/2012 | Hayashi | 257/99 |
| 8,334,587 B2 * | 12/2012 | Inoue et al. | 257/692 |
| 2001/0007780 A1 * | 7/2001 | Minamio et al. | 438/106 |
| 2003/0075783 A1 | 4/2003 | Yoshihara et al. | |
| 2007/0080357 A1 * | 4/2007 | Ishii | 257/98 |
| 2008/0029857 A1 * | 2/2008 | Kiyohara et al. | 257/667 |
| 2008/0093715 A1 * | 4/2008 | Lange et al. | 257/667 |
| 2008/0122049 A1 * | 5/2008 | Zhao et al. | 257/669 |
| 2009/0032977 A1 * | 2/2009 | Yamaguchi | 257/787 |
| 2009/0091007 A1 * | 4/2009 | Tellkamp | 257/666 |
| 2009/0224271 A1 * | 9/2009 | Seo et al. | 257/98 |
| 2010/0001306 A1 * | 1/2010 | Park et al. | 257/99 |
| 2010/0276806 A1 * | 11/2010 | Masuda et al. | 257/762 |
| 2011/0108967 A1 * | 5/2011 | Bai et al. | 257/676 |

FOREIGN PATENT DOCUMENTS

| | | | |
|---|---|---|---|
| JP | 2003-124437 A | | 4/2003 |
| JP | 2007-103597 A | | 4/2007 |
| JP | 2007-103597 A | | 4/2007 |
| JP | 2010197102 A | * | 9/2010 |

* cited by examiner (a)

(b)

(c)

(a)

(b)

(a)

(b)

(c)

(a)

(b)

(c)

SEMICONDUCTOR DEVICE HAVING LEADS WITH CUTOUT AND METHOD OF MANUFACTURING THE SAME

RELATED APPLICATIONS

This application is the U.S. National Phase under 35 U.S.C. §371 of International Application No. PCT/JP2012/000313, filed on Jan. 19, 2012, which in turn claims the benefit of Japanese Application No. 2011-029362, filed on Feb. 15, 2011, the disclosures of which Applications are incorporated by reference herein.

TECHNICAL FIELD

The present invention relates to semiconductor devices and methods of manufacturing the same.

BACKGROUND ART

Downsizing of control devices (e.g., inverter control devices) has been required. Accordingly, semiconductor devices (e.g., power modules) included in the control devices have been also downsized and reduced in weight.

For example, a lead frame including a power element and a lead frame including a control element for controlling the power element are electrically joined together, and the lead frames are encapsulated in a package made of a resin material, thereby forming a semiconductor device. A semiconductor device including a power element needs to ensure a distance for insulation between external terminals which are at high potentials. To meet this need, for example, PATENT DOCUMENT 1 describes a semiconductor device in which a concave creepage structure (concave structure) is formed in a region between external terminals to ensure a creepage distance.

FIGS. 11(a)-11(c) illustrate a conventional semiconductor device including a general creepage structure. The conventional semiconductor device including the creepage structure includes a lead frame 103, a power element 101 held on a die pad 109A, a control element 111 held on a die pad 109B, and a package 106 made of a resin material. The lead frame 103 includes a plurality of leads (external terminals) 105, and the die pads 109A and 109B. The package 106 encapsulates the power element 101, the control element 111, the die pads 109A and 109B, and end portions of the leads 105 located near the die pads 109A and 109B. The power element 101 and the end portions of some of the leads 105 located near the die pad 109A are electrically connected together through metal members 121. The control element 111 and the power element 101 are electrically connected together through a gold wire 122, and the control element 111 is electrically connected to the end portions of the other leads 105 located near the die pad 109B through other gold (Au) wires 122.

Here, in the conventional semiconductor device, concave structures 106a are formed in regions of the package 106 between adjacent pairs of the leads 105 as illustrated in FIG. 11(b) which is an enlarged view of a region C in FIG. 11(a).

As such, in the conventional semiconductor device, the concave structures 106a ensure creepage distances between adjacent pairs of the leads 105, and reduce the distances between adjacent pairs of the leads 105, thereby downsizing the semiconductor device.

CITATION LIST

Patent Document

PATENT DOCUMENT 1: Japanese Patent Publication No. 2003-124437

SUMMARY OF THE INVENTION

Technical Problem

A package for a conventional semiconductor device needs to include a concave structure in order to ensure a creepage distance. However, this concave structure serves as a constraint for ensuring a creepage distance to address downsizing of semiconductor devices. Furthermore, in order to form a package having a complicated outer shape including, e.g., the concave structure, structures of seal molds are complicated.

When a progress toward downsizing of semiconductor devices, a future increase in current amount, and a future increase in voltage are taken into account, the above problems may become more significant.

An object of the present invention is to provide a semiconductor device configured to ensure a creepage distance without a package having a concave structure.

Solution to the Problem

In order to achieve the above object, a semiconductor device according to the present invention includes: leads in each of which a cutout is formed; a die pad; a first element held on the die pad; and a package made of a resin material, and configured to encapsulate inner end portions of the leads, and the die pad including the first element. The cutout is located in a region of each of the leads including a portion of the lead at a boundary between the lead and the package, and is filled with a resin material.

A method of manufacturing a semiconductor device according to the present invention includes: preparing a die pad on which a first element is held, and leads each having a cutout; and clamping the cutout of each of the leads between molds, and injecting an encapsulating resin material between the molds, thereby encapsulating inner end portions of the leads and the die pad including the first element with the resin material.

Effects of the Invention

The semiconductor device according to the present invention and the method of manufacturing the same can ensure a creepage distance without forming a concave structure in a package.

DESCRIPTION OF EMBODIMENT

An embodiment of the present invention will be described with reference to the drawings.

The present invention is not limited to the following description as long as the invention is based on the fundamental features described in the specification.

Figure 1:
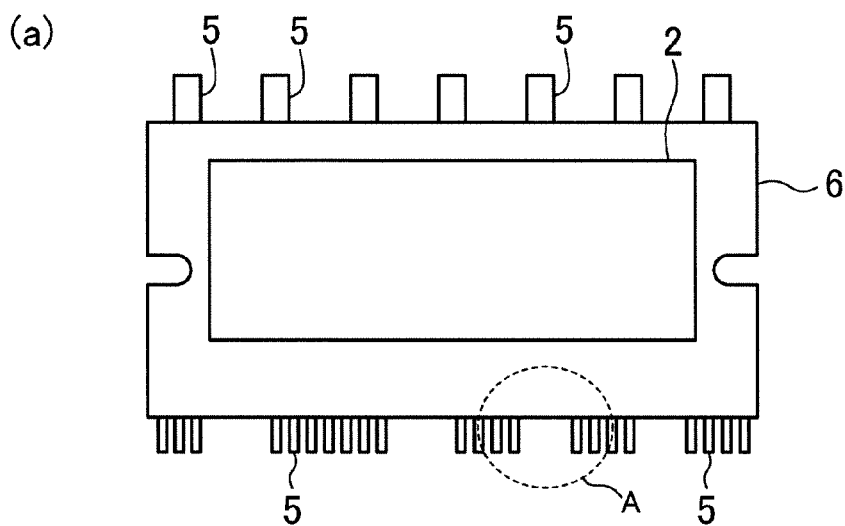
FIG. 1(a) is a plan view illustrating a semiconductor device according to an embodiment of the present invention.
FIG. 1(b) is an enlarged plan view of a region A in FIG. 1(a).
FIG. 1(c) is a detailed plan view of the region A.
Figure 1:
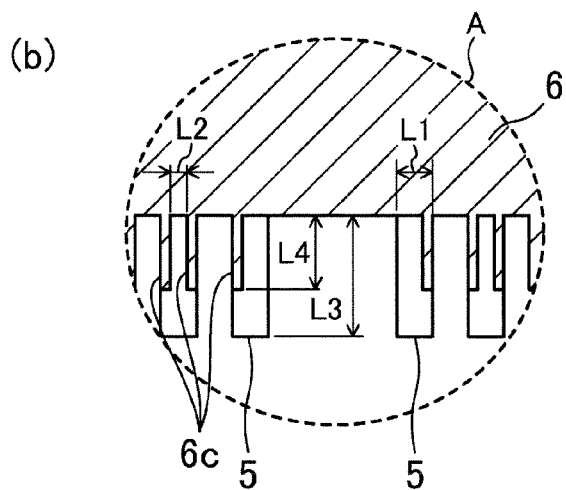
Figure 1:
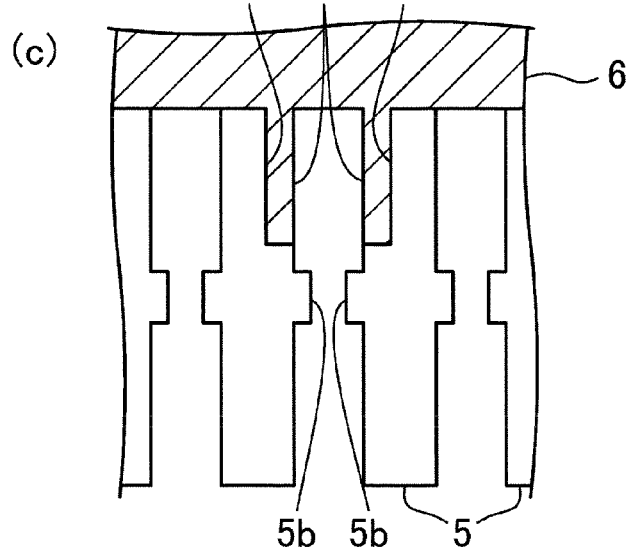
Figure 3:
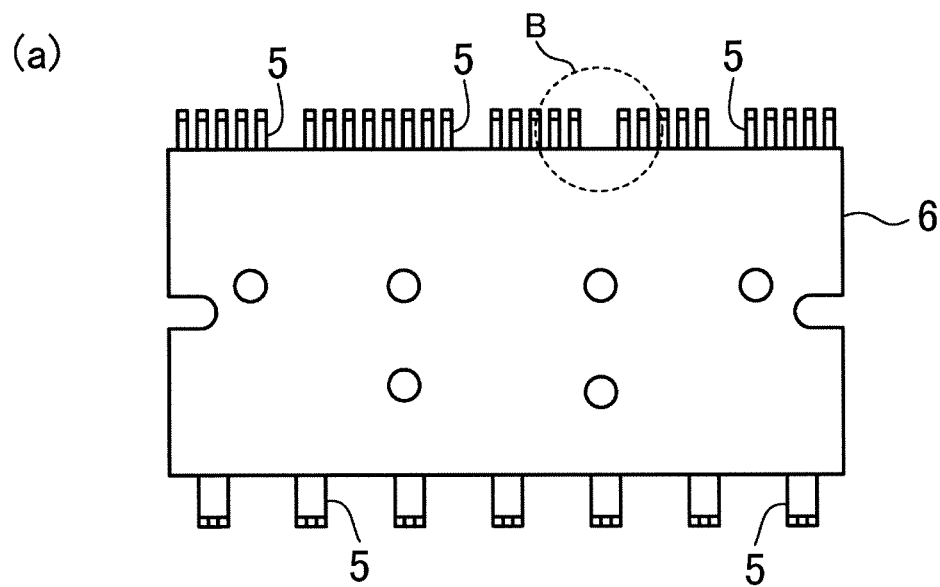
FIG. 3(a) is a bottom view illustrating the semiconductor device according to the embodiment of the present invention.
FIG. 3(b) is an enlarged bottom view of a region B in FIG. 3(a).
Figure 3:
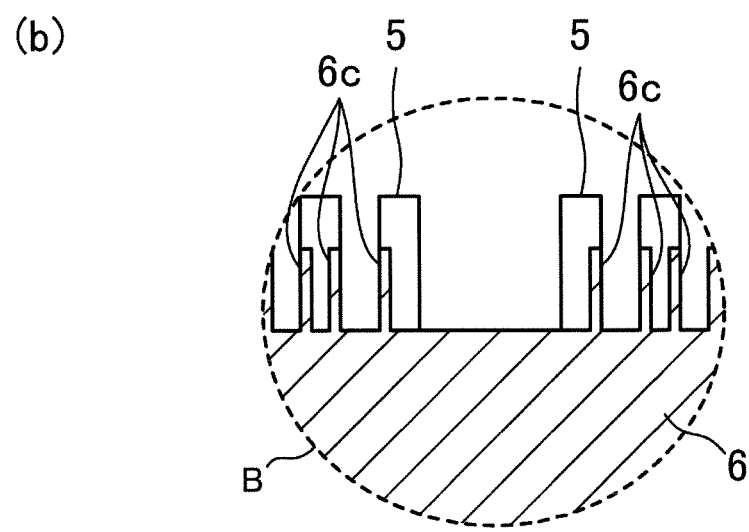
Figure 4:
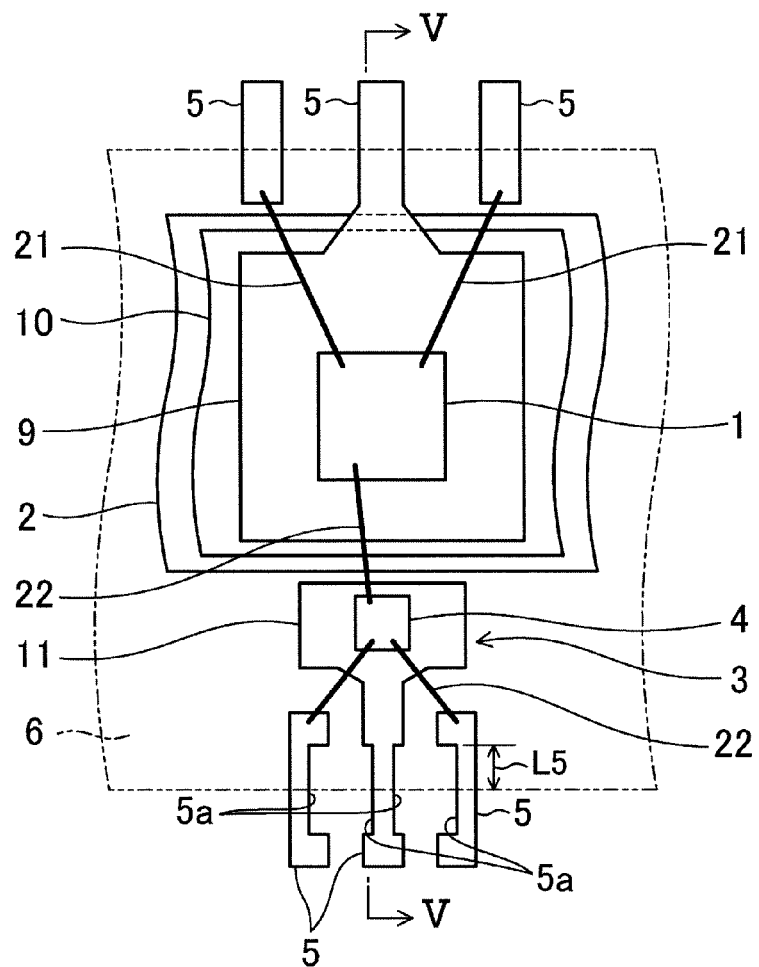
FIG. 4(a) is a plan view illustrating an internal structure of the semiconductor device according to the embodiment of the present invention.
FIGS. 4(b) and 4(c) are partial plan views illustrating variations of the shape of each of cutouts according to the embodiment.
Figure 4:
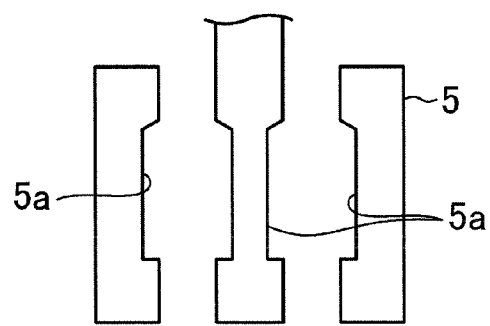
Figure 4:
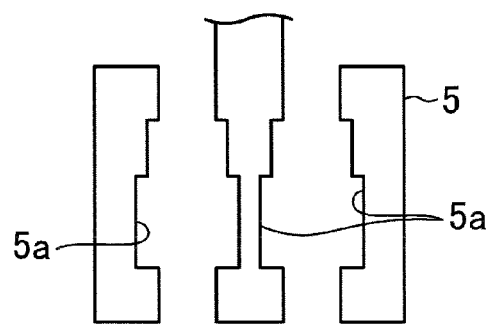
Figure 5:
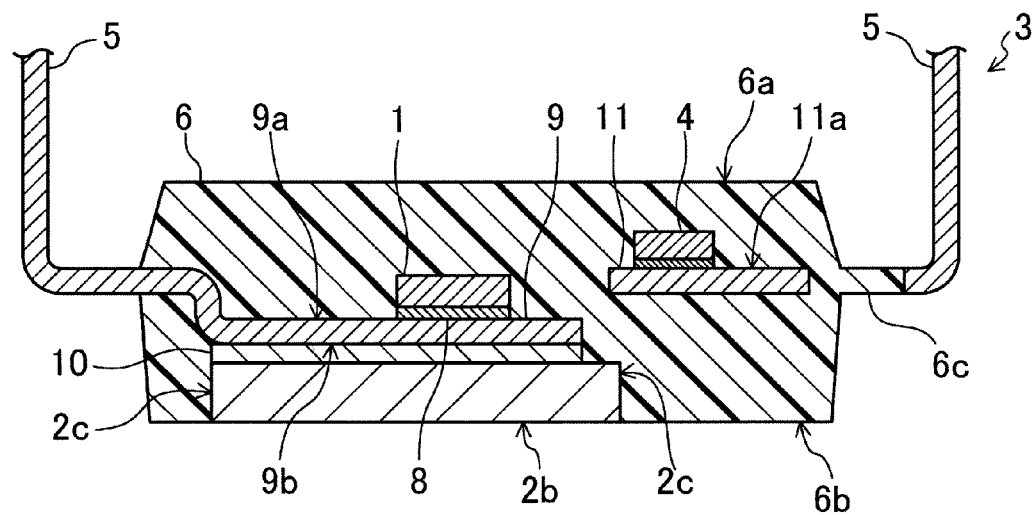
FIG. 5 is a cross-sectional view taken along the line V-V in FIG. 4.

FIG. 1(a) is a plan view illustrating a semiconductor device according to the embodiment of the present invention. FIG. 1(b) is an enlarged plan view of a region A in FIG. 1(a). FIG. 1(c) is a detailed plan view of the region A. FIG. 3(a) is a bottom view of the semiconductor device according to the embodiment of the present invention. FIG. 3(b) is an enlarged bottom view of a region B in FIG. 3(a). FIG. 4(a) is a plan view illustrating an internal structure of the semiconductor device according to the embodiment of the present invention. FIGS. 4(b) and 4(c) are partial plan views illustrating variations of the shape of each of cutouts according to the embodiment. FIG. 5 is a cross-sectional view taken along the line V-V in FIG. 4.

As illustrated in FIGS. 1 and 3-5, a semiconductor device according to this embodiment includes a power element 1, a heat sink 2, lead frames 3, a control element 4, and a package 6. The lead frames 3 each include a corresponding one of a first die pad 9 and a second die pad 11, and a plurality of leads 5 serving as external terminals. The package 6 integrally encapsulates the power element 1, the control element 4, and inner end portions of the plurality of leads 5. The package 6 is made of an encapsulating resin material. The power element 1 is an example of a first element. The control element 4 is an example of a second element.

Examples of the semiconductor device of this embodiment include a power module (power semiconductor device). The semiconductor device of this embodiment is used while being incorporated into, e.g., a control device.

The lead frames 3 are made of a material having excellent conductivity, such as copper (Cu). The lead frames 3 include the leads 5 protruding beyond side surfaces of the package 6 and forming external terminals, and are connected to a circuit of inverter control equipment, etc., as mounting terminals of the semiconductor device.

The power element 1 is fixed to an upper surface 9a of the first die pad 9 of one of the lead frames 3 using, for example, a solder material 8 or a silver (Ag) paste material. Bonding pads (not shown) of the power element 1 and the leads 5 of the lead frame 3 are electrically connected through metal members 21. Examples of the power element 1 can include an insulated gate bipolar transistor (IGBT) and a power metal-oxide-semiconductor field-effect transistor (MOSFET). Examples of the metal members 21 can include aluminum (Al) wires, metal wires made of gold (Au), copper (Cu), etc., aluminum (Al) ribbons, and copper (Cu) clips. The aluminum ribbons and the copper clips have a larger cross sectional area and a lower wiring resistance than the aluminum wires, and thus, can reduce power loss in the metal members 21. In this embodiment, a horizontal power MOSFET with a built-in diode is used as an example of the power element 1, and aluminum wires are used as an example of the metal members 21.

As illustrated in FIG. 5, the heat sink 2 is fixed to a lower surface 9b of the first die pad 9 of the lead frame 3 with an insulating sheet 10 interposed therebetween. The heat sink 2 may be made of metal having excellent thermal conductivity, such as copper (Cu) or aluminum (Al).

The insulating sheet 10 is made of a thermally conductive insulating material, and is a three-layer sheet including, e.g., an insulating layer sandwiched between adhesive layers. The insulating sheet 10 is provided to effectively transfer heat generated by the power element 1 to the heat sink 2.

The control element 4 includes, e.g., a drive circuit and an overcurrent protection circuit. The control element 4 is fixed to an upper surface 11a of the second die pad 11 of another one of the lead frames 3, for example, using a silver (Ag) paste material. Bonding pads (not shown) of the control element 4 are electrically connected to the plurality of leads 5 of the lead frame 3 through gold (Au) wires 22. Furthermore, a bonding pad (not shown) of the power element 1 is electrically connected to another bonding pad (not shown) of the control element 4 through another gold wire 22. The gold wires 22 allow the control element 4 to control the power element 1.

The package 6 covers the power element 1, the first die pad 9, the control element 4, the second die pad 11, inner end portions of the leads 5, the upper surface of the heat sink 2, and side surfaces 2c of the heat sink 2. Therefore, the lower surface 2b of the heat sink 2 is exposed from the lower surface 6b of the package 6.

As illustrated in FIG. 5, the lower surface 2b of the heat sink 2 is exposed from the lower surface 6b of the package 6. Therefore, heat generated by the power element 1 can efficiently be transferred from the lower surface 2b of the heat sink 2 to the outside. The side surfaces 2c of the heat sink 2 are covered with the package 6, thereby reinforcing bonding between the heat sink 2 and the corresponding lead frame 3.

As illustrated in FIG. 4, a feature of the semiconductor device according to this embodiment is that cutouts (concave portions) 5a are previously formed in side surfaces of some of the leads 5 protruding beyond side surfaces of the package 6 and serving as external terminals. Therefore, the semiconductor device according to this embodiment includes resin-filled portions 6c formed by filling the cutouts 5a formed in the side surfaces of the leads 5 with a resin material forming the package 6 as illustrated in FIGS. 1(b) and 3(b).

Specifically, in the semiconductor device according to this embodiment, the cutouts 5a previously formed in the leads 5 are filled with the resin material in a process step of encapsulating the package 6, thereby forming the resin-filled portions 6c. This allows integral connection between the resin-filled portions 6c and the package 6, and thus, no interface exists between the resin-filled portions 6c and the package 6.

Here, the leads 5 including the cutouts 5a are leads connected directly to the control element 4. The reason for this is that the number of input/output signals needed by the control element 4 is typically greater than that of input/output signals needed by the power element 1. Thus, in order to downsize the semiconductor device itself, the distance between each adjacent pair of the leads 5 connected directly to the control element 4 needs to be reduced as illustrated in FIG. 1(a). When, e.g., the breakdown voltage between each adjacent pair of the leads 5 connected directly to the power element 1 in a design stage needs to be increased, cutouts 5a may be previously formed in the leads 5 connected to the power element 1 to form resin-filled portions 6c.

Here, the leads 5 of the semiconductor device according to this embodiment will be more specifically described with reference to FIG. 1(c) which is an enlarged view of a principal portion of the semiconductor device in FIG. 1(b). In the semiconductor device according to this embodiment, as illustrated in FIG. 1(c), a dam bar 5b is severed so that pieces of the dam bar 5b are left on side surfaces of the corresponding leads 5, and flash is removed from the resin-filled portions 6c. The resin-filled portions 6c and the cutouts 5a of the semiconductor device according to this embodiment are formed inwardly from the dam bar 5b (toward the package 6) without being in contact with the dam bar 5b as illustrated in FIG. 1(c). The reason for this is that when the dam bar 5b is severed, the resin-filled portions 6c are prevented from being severed using a dam bar severing blade 14.

Figure 2:
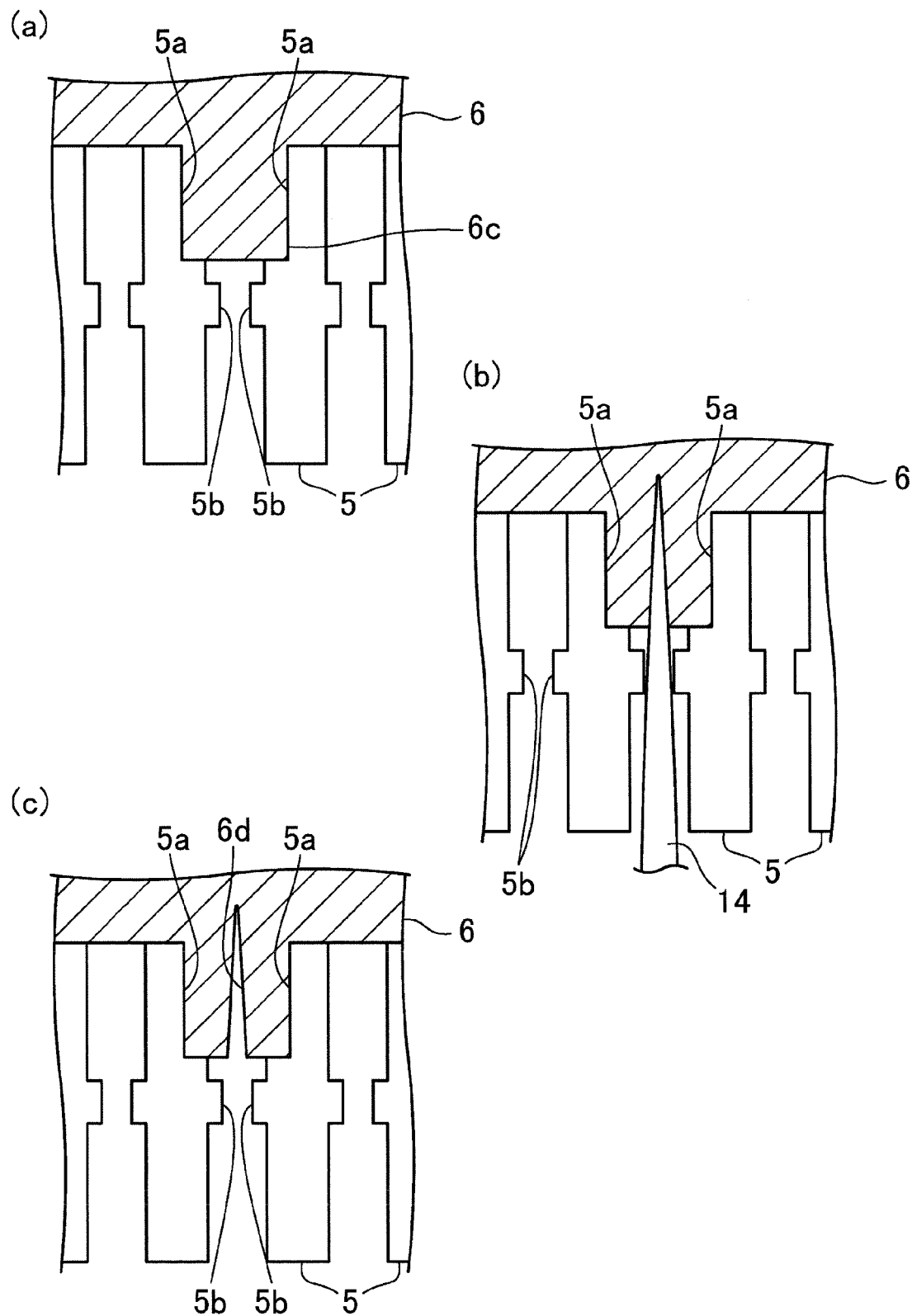
FIG. 2(a) is an enlarged plan view of the region A in a process step according to a variation.
FIG. 2(b) is an enlarged plan view of the region A in a process step according to the variation.
FIG. 2(c) is an enlarged plan view of the region A of a semiconductor device according to the variation.

The structure in FIG. 2(c) can be used as a variation of the structure in FIGS. 1(b) and 1(c). The structure in FIG. 2(c) is formed through process steps in FIGS. 2(a) and 2(b).

FIG. 2(a) is a diagram illustrating how a space between the cutouts 5a is filled with resin in the variation. FIG. 2(b) is a diagram illustrating that a groove 6d is formed by severing the resin with which the space between the cutouts 5a is filled using the dam bar severing blade 14 in the variation.

In FIG. 1(c) described above, the resin-filled portions 6c are prevented from being severed using the dam bar severing blade 14; however, in FIGS. 2(a)-2(c) illustrating the variation, a resin-filled portion 6c in the variation is severed using the dam bar severing blade 14, thereby forming the groove 6d. As such, the groove 6d parallel to the direction in which the leads 5 protrude is formed in the resin-filled portion 6c in the variation, and thus, the resin-filled portion 6c can include the groove 6d formed between a corresponding adjacent pair of the leads 5. The groove 6d is formed as illustrated in FIGS. 2(a)-2(c), thereby increasing the creepage distance.

Here, when the creepage distance is to be further increased, a concave portion is preferably formed in the package 6 by inserting the dam bar severing blade 14 into the package 6 as illustrated in FIG. 2(c). In this case, the height of the package 6 (the width thereof in a direction perpendicular to the plane of the paper of this figure) is sufficiently greater than that of each of the leads 5, and thus, for example, the package 6 is not broken. When, as such, a concave portion is formed in the package 6 using the dam bar severing blade 14, a portion of the groove 6d formed in the resin-filled portion 6c can be located in the package 6.

The package 6 is made of a thermosetting resin material, such as an epoxy-based resin. For example, a material obtained by blending a crushed filler or a spherical filler into an epoxy-based resin is preferably used as a resin material forming the package 6 and the resin-filled portion 6c. When, e.g., alumina (aluminum oxide) is used as the spherical filler, the thermal conductivity of the resin-filled portion 6c can be improved.

Since, in the semiconductor device of this embodiment, the cutouts 5a are formed in the leads 5, the leads 5 including the resin-filled portions 6c need to have a predetermined strength. Therefore, in the semiconductor device of this embodiment, the distance L2 between the resin-filled portions 6c formed in one of the leads 5 is greater than or equal to 0.4 mm in FIG. 1(b). The distance L2 between the resin-filled portions 6c varies depending on the material, width, and length of the lead 5; however, it is preferably greater than or equal to at least 0.4 mm. Here, the distance L2 is substantially equal to the width of a portion of the lead 5 in which the cutouts 5a are formed. When the distance L2 is greater than or equal to 0.4 mm, this allows the lead 5 to have a predetermined strength, and can reduce an increase in the resistance of the lead 5 including the cutouts 5a. Here, the width L1 of each of the leads 5 is generally greater than or equal to 0.5 mm and less than or equal to 2.0 mm.

Furthermore, in the semiconductor device of this embodiment, in order to increase the creepage distance between each adjacent pair of the leads 5 to the maximum possible extent, the maximum length L4 of each of the resin-filled portions 6c is equal to 2.0 mm while the length L3 of protrusion of each of the leads 5 is greater than or equal to 2.0 mm and less than or equal to 5.0 mm.

When the leads 5 have a sufficient strength, the resin-filled portions 6c can be formed in both lateral side surfaces of any lead 5 as illustrated in FIG. 1(b). When the resin-filled portion 6c is formed in at least one of an adjacent pair of the leads 5, this can increase the creepage distance between the pair of the leads 5. However, when the creepage distance is to be increased to the maximum possible extent, the resin-filled portions 6c are preferably formed in both lateral side surfaces of any lead 5.

The length L5 of a portion of each of the cutouts 5a located in the package 6 (see FIG. 4(a)) may be greater than the diameter of the filler blended into the resin material. In this embodiment, the length L5 is set, for example, greater than or equal to 20 μm.

The wall of the portion of each of the cutouts 5a located in the package 6 may be inclined toward the inside of the package 6 as illustrated in FIG. 4(b). Alternatively, the wall may be step-wise as illustrated in FIG. 4(c). When the wall forms the shape illustrated in FIG. 4(b) or 4(c), the cutouts 5a are easily filled with a resin material for forming the resin-filled portions 6c.

As described above, in the semiconductor device of this embodiment, the cutouts 5a are previously formed in surfaces of some of the leads 5 serving as the external terminals at the boundaries between the leads 5 and the package 6. The cutouts 5a are filled with the resin material forming the package 6, thereby forming the resin-filled portions 6c. This eliminates the need for a concave structure which has been conventionally needed to improve electrical insulation properties of the semiconductor device and which has been formed in the outer surface of a corresponding package. This can reduce the outer dimensions of the package forming the semiconductor device.

Furthermore, the semiconductor device according to this embodiment includes the package 6 having a simple shape, thereby simplifying the structures of molds for manufacturing the package 6.

In this embodiment, the resin-filled portions 6c are formed by filling the cutouts 5a with the resin material for forming the resin-filled portions 6c with injection of the resin material forming the package 6. Therefore, the composition of the resin material forming the package 6 is identical with that of the resin material forming the resin-filled portions 6c.

However, in a variation of the semiconductor device of this embodiment, cutouts 5a can be previously filled with a resin material before injection of a resin material forming a package 6. This allows filling of the cutouts 5a with a resin material having a different composition from that of the resin material forming the package 6, such as a low-dielectric-constant insulative resin material, or an insulative resin material with good heat dissipation characteristics. When the cutouts 5a are filled with a low-dielectric-constant insulative resin material, this can improve the insulation properties of the resin-filled portions 6c. When the cutouts 5a are filled with an insulative resin material with good heat dissipation characteristics, this can improve heat dissipation of the resin-filled portions 6c.

(Manufacturing Method)

An example of a method of manufacturing a semiconductor device according to this embodiment will be described hereinafter with reference to FIGS. 6-10.

Figure 6:
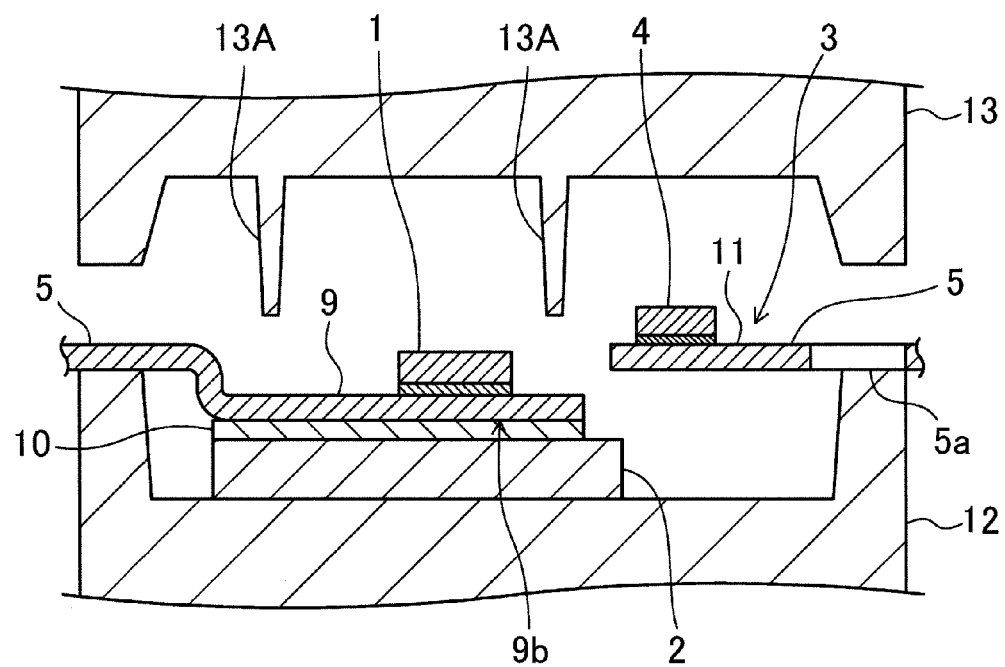
FIG. 6 is a schematic cross-sectional view illustrating a process step in a method of manufacturing a semiconductor device according to the embodiment of the present invention.

First, as illustrated in FIG. 6, a heat sink 2 having an upper surface to which an insulating sheet 10 is temporarily adhered is placed on the underside of a lower mold 12 with the insulating sheet 10 facing up. Subsequently, a lead frame 3 to which a power element 1 is fixed and connected through metal members and a lead frame 3 to which a control element 4 is fixed and connected through gold wires are placed in the lower mold 12 with a lower surface 9b of a first die pad 9 in contact with the insulating sheet 10. In this case, as illustrated in FIG. 4, cutouts 5a are previously formed in leads 5 connected directly to the control element 4. For example, a mechanical pressing process or a chemical etching process can be used to form the cutouts 5a. FIGS. 6-10 are cross-sectional views equivalent to FIG. 5, and the metal members 21 and the gold wires 22 are not shown.

As illustrated in FIG. 6, an upper mold 13 corresponding to the lower mold 12 includes mold insert pins 13A.

Here, in this embodiment, when the cutouts 5a are filled with a resin material by allowing the resin material to flow into the cutouts 5a, an end of each of the cutouts 5a formed in side surfaces of some of the leads 5 serving as external terminals is clamped between the upper and lower molds 13 and 12 to prevent the resin material from protruding outside the cutouts 5a. Specifically, the cutouts 5a are located in a space surrounded by the upper and lower molds 13 and 12. This location allows the formation of the resin-filled portions 6c at desired locations while preventing the resin material from protruding outside the cutouts 5a in the injection of the resin material.

Figure 7:
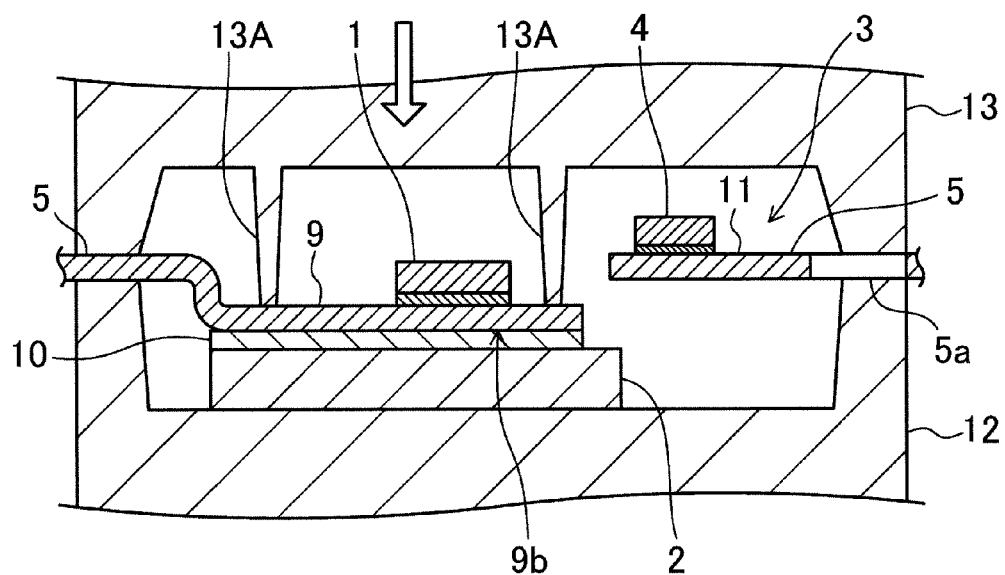
FIG. 7 is a schematic cross-sectional view illustrating a process step in the method of manufacturing a semiconductor device according to the embodiment of the present invention.

Next, as illustrated in FIG. 7, the upper mold 13 moves down toward the lower mold 12 to clamp the lead frames 3 between the upper mold 13 and the lower mold 12 from above and below. Here, the plurality of mold insert pins 13A of the upper mold 13 are located above a first die pad 9 of one of the lead frames 3. Therefore, when the upper mold 13 is moved down, and the lead frames 3 are clamped between the upper mold 13 and the lower mold 12 from above and below, the mold insert pins 13A press the first die pad 9 of the lead frame 3 placed on the heat sink 2 downward. As a result, the heat sink 2 adhered to the lower surface 9b of the first die pad 9 of the lead frame 3 is pressed by the lower mold 12.

Thus, as illustrated in FIG. 7, at least one of the plurality of mold insert pins 13A is located between the power element 1 and the control element 4 when viewed in plan. In this case, the at least one mold insert pin 13A located between the power element 1 and the control element 4 is in the shape of a truncated cone having a diameter increasing upward from a surface thereof in contact with the first die pad 9 of the lead frame 3. The shape of the mold insert pin 13A may be in the shape of a truncated pyramid.

Figure 8:
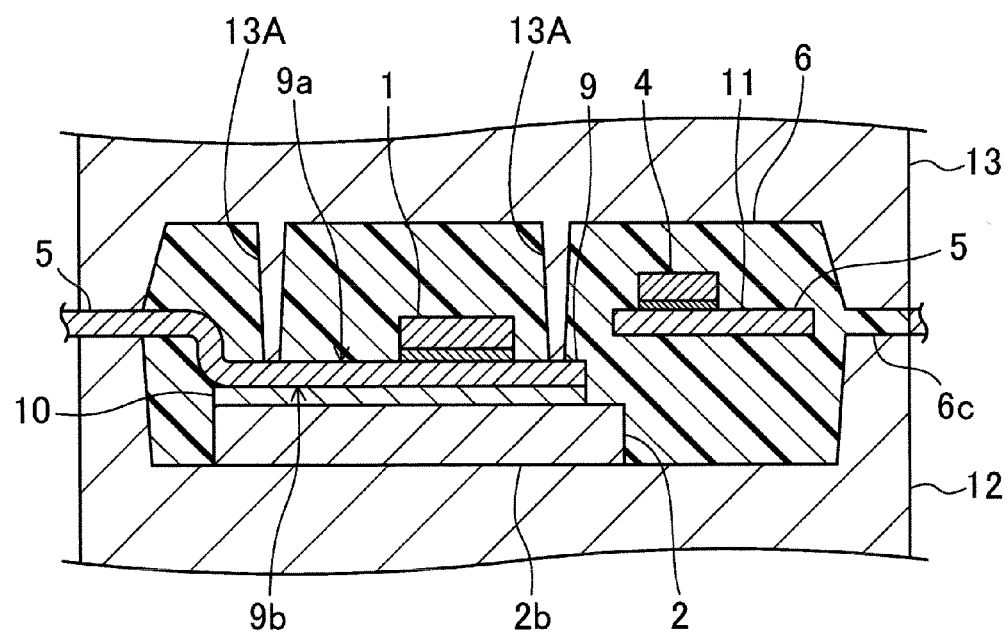
FIG. 8 is a schematic cross-sectional view illustrating a process step in the method of manufacturing a semiconductor device according to the embodiment of the present invention.

Next, in a resin injection process step, an encapsulating resin material, such as an epoxy resin, is injected between the upper and lower molds 13 and 12 by transfer molding. The injection of the resin material allows formation of a package 6 which encapsulates portions of the lead frames 3 located inside the molds, the power element 1, the control element 4, and side surfaces of the heat sink 2 while covering them as illustrated in FIG. 8. Since, in this case, the heat sink 2 is pressed onto the lower mold 12 by the mold insert pins 13A, the injected resin material does not flow onto the lower surface 2b of the heat sink 2. In this resin injection process step, the cutouts 5a previously formed in predetermined ones of the leads 5 protruding beyond a side surface of the package 6 are filled with the injected resin material, and thus, resin-filled portions 6c having a composition identical with the composition of the package 6 are connected integrally to the package 6.

In the manufacturing method of this embodiment, the injected resin material does not exist on the lower surface 2b of the heat sink 2 after resin encapsulation. As a result, heat can efficiently be dissipated through the power element 1 and the heat sink 2 to the outside of the package 6.

The upper surface 9a of the first die pad 9 is pressed by the mold insert pins 13A, thereby allowing the mold insert pins 13A to slightly bite into the upper surface 9a of the first die pad 9. Thus, the resin material does not flow onto the surface of the first die pad 9 in contact with the mold insert pins 13A.

In a resin encapsulation process step of the manufacturing method of this embodiment, an adhesive layer (not shown) of the insulating sheet 10 arranged between the first die pad 9 of the lead frame 3 and the heat sink 2 is molten by heat transferred from the lower and upper molds 12 and 13, and is further cured. Thus, the insulating sheet 10, the lower surface 9b of the first die pad 9 of the lead frame 3, and the heat sink 2 are more securely adhered.

Figure 9:
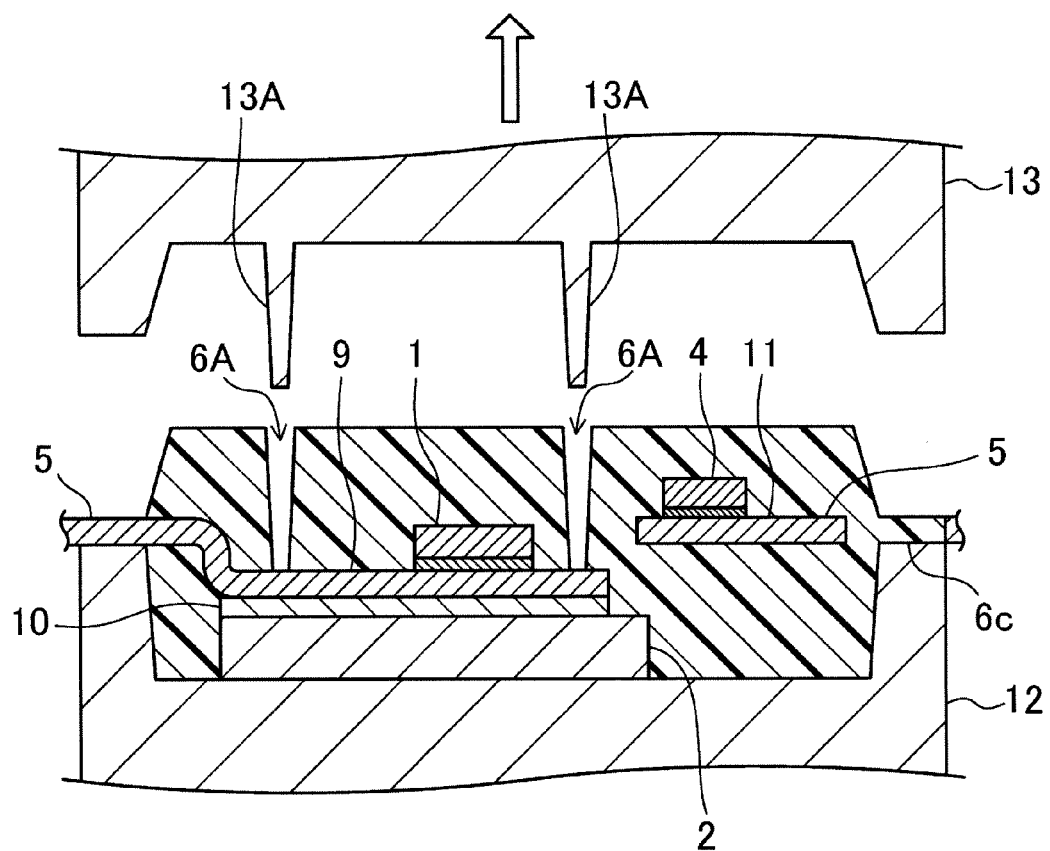
FIG. 9 is a schematic cross-sectional view illustrating a process step in the method of manufacturing a semiconductor device according to the embodiment of the present invention.

Next, when the upper mold 13 is moved up as illustrated in FIG. 9 after curing of the resin material and resin encapsulation, openings 6A each having a diameter increasing upward from the first die pad 9 of the lead frame 3 are formed in portions of the package 6 into which the mold insert pins 13A were inserted. Since each of the mold insert pins 13A is in the shape of a truncated cone, each of the openings 6A is also in the shape of a truncated cone, and thus, the mold insert pins 13A are easily removed from the package 6. In this case, the encapsulating resin material is not adhered to the surfaces of the first die pad 9 exposed from the openings 6A, and the first die pad 9 of the lead frame 3 is exposed in the openings 6A. The openings 6A can be easily filled with a resin material depending on the uses and purposes of the openings 6A, and the openings 6A can be closed by filling the openings 6A with a resin material.

Figure 10:
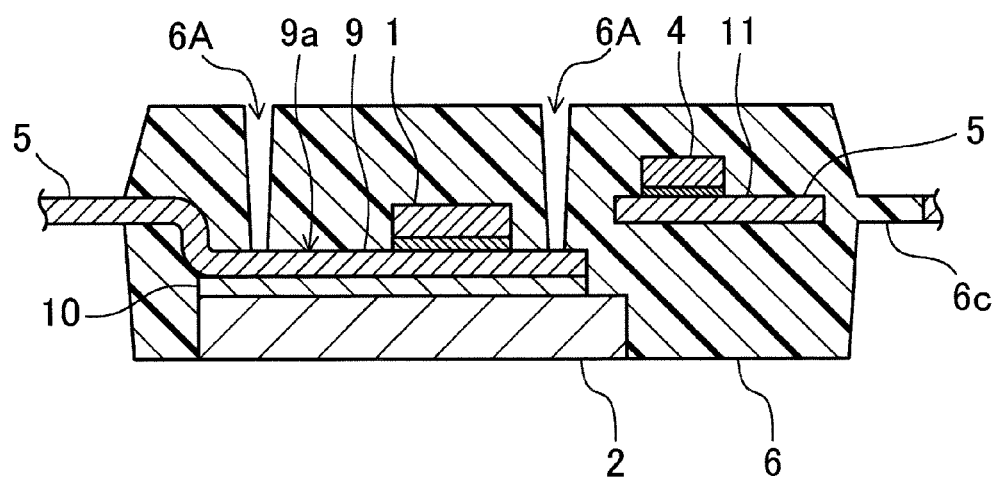
FIG. 10 is a schematic cross-sectional view illustrating a process step in the method of manufacturing a semiconductor device according to the embodiment of the present invention.
Figure 11:
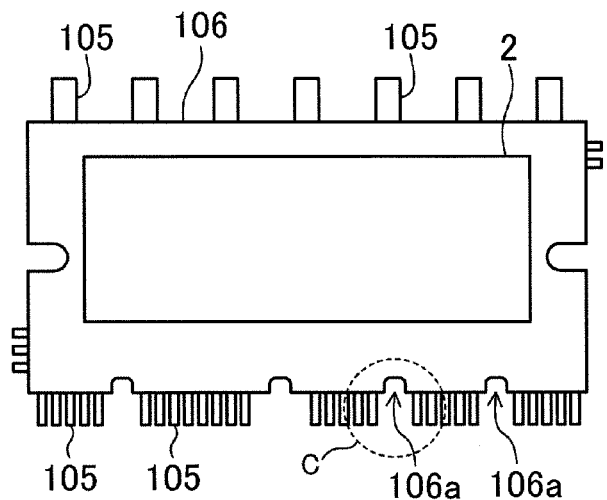
FIG. 11(a) is a plan view illustrating a conventional semiconductor device.
FIG. 11(b) is an enlarged plan view of a region C in FIG. 11(a).
FIG. 11(c) is a schematic plan view illustrating an internal structure of the conventional semiconductor device.
Figure 11:
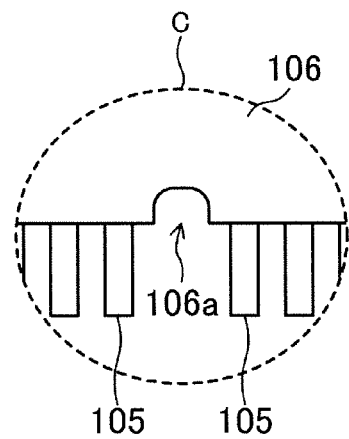
Figure 11:
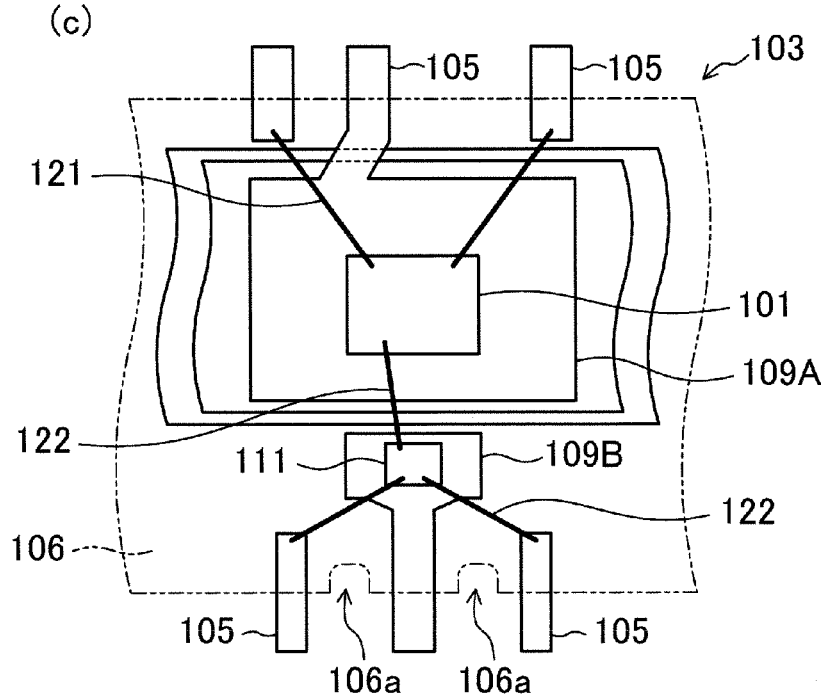

As such, the semiconductor device illustrated in FIG. 10 can be manufactured.

As described above, in this embodiment, the cutouts 5a are previously formed in the leads 5 protruding beyond a side surface of the package 6 and serving as external terminals, and the cutouts 5a are filled with the same resin material as the encapsulating resin material, thereby forming the resin-filled portions 6c. In this manner, the resin-filled portions 6c are formed in the leads 5, thereby providing better electrical insulation between the leads 5 close to each other, and reducing the outer dimensions of the package 6. Furthermore, the structures of the molds for manufacturing the package 6 can be simplified.

INDUSTRIAL APPLICABILITY

The semiconductor device according to the present invention and a method of manufacturing the same can be practiced with semiconductor devices, such as IGBT modules or intelligent power modules (IPM).

DESCRIPTION OF REFERENCE CHARACTERS

1 Power Element
2 Heat Sink
2*b* Lower Surface
2*c* Side Surface
3 Lead Frame
4 Control Element
5 Lead
5*a* Cutout
5*b* Dam Bar
6 Package
6*a* Upper Surface
6*b* Lower Surface
6*c* Resin-Filled Portion
6*d* Groove
6A Opening
8 Solder Material
9 First Die Pad
9*a* Upper Surface
9*b* Lower Surface
10 Insulating Sheet
11 Second Die Pad
11*a* Upper Surface
12 Lower Mold
13 Upper Mold
13A Mold Insert Pin
14 Dam Bar Severing Blade
21 Metal Member
22 Gold Wire

The invention claimed is:

1. A semiconductor device, comprising:
   leads in each of which a cutout is formed;
   a die pad;
   a first element held on the die pad; and
   a package made of a first resin material, and configured to encapsulate inner end portions of the leads, and the die pad including the first element, wherein
   a portion of the cutout is inside the package, another portion of the cutout is outside the package, and the portion of the cutout inside the package and the another portion of the cutout outside the package are filled with a second resin material, and
   the second resin material with which the cutout is filled is connected integrally to the resin material forming the package.

2. The semiconductor device of claim 1, wherein the second resin material with which the cutout is filled has a composition identical with a composition of the first resin material forming the package.

3. The semiconductor device of claim 1, wherein the cutout is formed in at least one of an adjacent pair of the leads.

4. The semiconductor device of claim 1, wherein the cutout is formed in each of both side surfaces of one of the leads.

5. The semiconductor device of claim 1, wherein the first element is a power element.

6. The semiconductor device of claim 5, further comprising:
   a control element which is a second element configured to control the power element, wherein the leads in each of which the cutout is formed are connected to the control element.

7. The semiconductor device of claim 1, wherein the cutout is formed in a portion of each of the leads located inwardly from a dam bar connected to the lead.

8. The semiconductor device of claim 1, wherein a groove parallel to a direction in which the leads protrude is formed in the first resin material with which a space between the cutouts of an adjacent pair of the leads is filled.

9. The semiconductor device of claim 8, wherein a portion of the groove is located inside the package.

10. The semiconductor device of claim 1, wherein a distance between resin-filled portions of one of the leads formed by the second resin material with which the cutout is filled is greater than or equal to 0.4 mm.

11. The semiconductor device of claim 1, wherein a portion of the cutout is located inside the package.

12. The semiconductor device of claim 11, wherein
   a length of a portion of the cutout located inside the package is greater than a diameter of a filler blended into the second resin material.

13. The semiconductor device of claim 1, wherein an inner wall of the cutout is inclined or step-wise.

14. The semiconductor device of claim 1, wherein a length of the portion of the cutout inside the package is greater than or equal to 20 μm.

15. A device comprising:
   the semiconductor device of claim 1.

16. A method of manufacturing a semiconductor device, the method comprising:
   preparing a die pad on which a first element is held, and leads each having a cutout, said cutout having a portion inside a package and another portion outside the package; and
   clamping the cutout of each of the leads between molds, and injecting an encapsulating resin material between the molds to fill the portion of the cutout inside the package and the another portion of the cutout outside the package with the resin material so as to integrally encapsulate inner end portions of the leads and the die pad including the first element with the resin material.

* * * * *